United States Patent [19]

Strickland

[11] 4,324,950

[45] Apr. 13, 1982

[54] AMPLIFIER FOR DRIVING ELECTROSTATIC LOUDSPEAKERS

[76] Inventor: James C. Strickland, 3101 SW. 1st Ter., Ft. Lauderdale, Fla. 33315

[21] Appl. No.: 51,735

[22] Filed: Jun. 25, 1979

Related U.S. Application Data

[63] Continuation-in-part of Ser. No. 803,931, Jun. 6, 1977.

[51] Int. Cl.³ .......................... H03F 5/00; H03F 3/20; H03G 1/04
[52] U.S. Cl. ...................... 179/1 A; 179/1 F; 179/111 R; 330/3; 330/71; 330/206; 330/293; 330/298; 328/198; 328/265; 328/267
[58] Field of Search ................... 179/1 A, 1 F, 111 R; 330/3, 70, 71, 293, 298, 206; 328/202, 198, 265-268

[56] References Cited

U.S. PATENT DOCUMENTS

| | | | |
|---|---|---|---|
| 1,950,365 | 3/1934 | Schmitt | 330/70 |
| 3,339,105 | 8/1967 | Busse | 328/268 |
| 3,361,981 | 1/1968 | Wolcott | 330/3 |
| 3,416,088 | 12/1968 | Baldwin | 330/3 |
| 3,526,845 | 9/1970 | Sikorra | 330/298 |
| 3,773,976 | 11/1973 | Beveridge | 179/1 F |
| 3,881,058 | 4/1975 | Klauck | 179/1 A |
| 3,908,170 | 9/1975 | Buhler | 330/3 |

OTHER PUBLICATIONS

Pulse and Digital Circuits by Millman & Taub, pp. 164-165, Section 5-10, "The Cathode Coupled Binary", ©1956, McGraw-Hill Book Co.

*Primary Examiner*—John S. Heyman
*Attorney, Agent, or Firm*—Blair, Brown & Kreten

[57] ABSTRACT

An amplifier for a capacitive load which includes a pair of high-voltage tube output circuits connected in a power output tube arrangement operating in push-pull for driving a capacitive load together with a feedback network connected between the Schmitt arrangement and a pair of transistors interconnected in a complementary difference amplifier circuit, the output of the complementary difference amplifier circuit connected to the driving tube of the power output tube arrangement to provide an amplifier output level having low distortion, positive DC centering and a high order of stability.

9 Claims, 2 Drawing Figures

AMPLIFIER FOR DRIVING ELECTROSTATIC LOUDSPEAKERS

This application is a continuation-in-part of Ser. No. 803,931, June 6, 1977.

BACKGROUND OF THE INVENTION

FIELD OF THE INVENTION

Electrostatic transducers capable of covering the audio spectrum from 30 Hz to 20,000 Hz present a capacitive load characteristic which is very difficult to drive. Such transducers typically require a push-pull signal approximating 3000 volts r.m.s. at low frequencies and about 1000 volts r.m.s. at mid-band and high frequencies. Such transducers have a highly capacitive character typically approximating 800 picofarads. This causes the driving source to see an impedance varying from about 7 megohms to less than 10 kilohms.

Practical electrostatic speakers made their debut in the early 1950's with Arthur Janszen's small tweeter array. This innovation was successful and is still available in much the same format today.

There have been more than a few attempts at full range electrostatic design for capacitive loads driven by conventional amplifiers over the years, and they have all had three problems in common, to wit inadequate sound output levels even when driven by exceedingly high powered amplifiers, generally inadequate bass response, and distortion and non-linearity caused by the necessity of using high voltage step-up transformers.

In addition, by trying to squeeze out more level with more and more power in this inefficient arrangement, panels are frequently over-driven and burned out.

The crux of the problem lies not so much with the electrostatic speakers themselves and their panels but rather with the amplifier that powers them. A full range electrostatic system does not pose any significant resistive load but does not provide an enormous capacitive load. Conventional amplifiers are designed for resistive loads. To give such an amplifier an 800-1000 pf capacitive load (faced through a 100:1 step-up transformer to obtain the required drive voltages) is to ask for marginal performance and poor reliability.

By designing an amplifier ideally matched to the high capacitive load, the design goals of high sound pressure level, excellent bass response, unrivaled linearity, low distortion and reliability could be easily met.

It is therefore clear to anyone skilled in the art that if the disadvantages of transformer audio step-up are to be avoided, this push-pull charge can best be accomplished by an arrangement employing a pair of high-voltage tube output circuits, employing the Schmitt connection (U.S. Pat. No. 1,950,365, Mar. 6, 1934) operating in push-pull.

The circuitry of the instant invention requires a much higher open-loop gain around which feedback could be taken to achieve stability, low distortion and positive DC centering. In Beveridge (U.S. Pat. Nos. 3,773,976 and 3,668,335) the feedback only loops the tubes and thus does not satisfy the requirements of having the surplus gain of the transistor stages to provide the high levels of correction necessary to achieve the objective sought.

The open loop gain of the instant invention is about 80 dB and uses about 34 dB of negative feedback, leaving a net closed-loop gain of about 46 dB.

SUMMARY AND OBJECTS OF THE INVENTION

It is the major object of the invention to provide a circuit capable of cooperating with the aforementioned Schmitt power outputs so as to yield low distortion, positive self-centering and a high order of stability.

A further object is to provide a circuit arrangement which inherently discharges dangerous potentials in the amplifier when power is removed.

A further object is to provide a method for preventing potentially destructive levels of dissipation in the vacuum tubes should certain types of circuit faults result in potentially destructive levels of current flow.

Another object of the application is to show a simple method of eliminating a troublesome ground-loop problem associated with the fact that such high-voltage amplifiers should be housed directly in a speaker enclosure, for reasons of safety.

A further object is to provide a simple arrangement for achieving automatic transition to operation from a standby mode in which low-power pre-heat is applied to the vacuum tube filaments so as to permit instantaneous operation, improved tube life and reduced moisture accumulation around high-voltage components.

The essence of the invention lies in the manner devised for co-operation of the aforementioned Schmitt power output tube connection and the associated drive transistors.

Other objects and advantages will become apparent in the following specification when considered in light of the attached drawings.

DESCRIPTION OF THE PREFERRED EMBODIMENT

Figure 1:
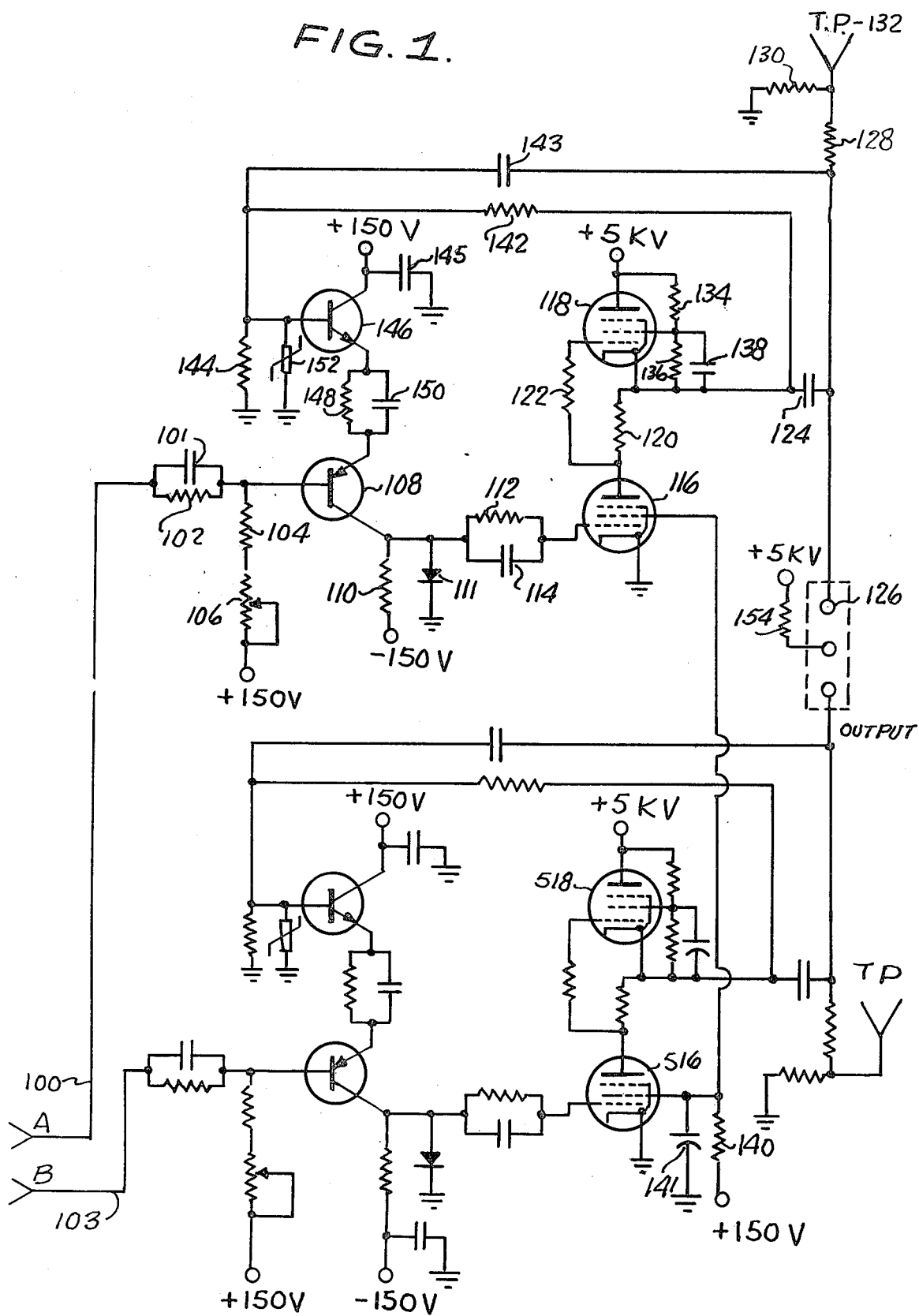
FIG. 1 shows the output circuit associated with the Schmitt output tube connection.

Push-pull drive signals of a few volts r.m.s. arrive from previous stages (to be examined later), along lines 100 and 103 at A, B of FIG. 1. Resistors 102, 104 and 106 provide a DC potential of about 8 V DC at the base of PNP transistor 108. Because series resistors 104 and 106 total roughly 200 times the resistance of resistor 102, the audio signal on line 100 appears with only about 0.04 dB loss at the base of transistor 108.

Transistor 108 operates as a normal collector output amplifier impressing its output across resistor 110. This amplified signal passes through resistor 112 and capacitor 114 into the grid of tube 116.

Tubes 116 and 118 form the classic Schmitt output arrangement in which the bottom tube 116 drives the top tube 118 as a "co-operative" load. The exact mechanism by which this happens is easily understood as follows:

Whenever the lower tube 116 draws more current, the potential drop across resistor 120 increases. This increased voltage drop is propogated through resistor 122 to the grid of tube 118. The increased bias on tube 118 causes a lower current flow through this tube. The net difference between the higher current in tube 116 and the now lower value in tube 118 flows as a charge pumping current through capacitor 124 into the capacitive load represented by an electrostatic speaker through output jack 126 (and jack 127).

When tube 116 sees increased grid bias, the voltage drop across resistor 120 is reduced. The resultant reduction of grid bias communicated to tube 118 through resistor 122 results in a higher current in tube 118 than in 116 and the net current difference again flows as charge pump current through capacitor 124, but now in the opposite direction from before.

Resistors 128 and 130 serve as a ground path for direct current and result in zero DC potential at jack 126.

Resistors 128 and 130 also form a voltage divider selected at 100:1 so that the AC signal at test point 132 is 1% of the high voltage output, a value which is convenient for test purposes.

Resistors 134 and 136 and capacitor 138 form a voltage divider and filter network to hold the screen potential relatively constant with respect to the cathode of tube 118.

Resistor 140 and capacitor 141 provide a similar function for tubes 116 and 516.

Virtually all amplifiers for high fidelity applications require substantial quantities of negative feedback to: (a) improve frequency response (b) lower distortion (c) reduce output impedance (d) provide for DC stability (centering).

Feedback, and its nature, are particularly necessary and important in this type of amplifier. Accomplishing it also presents certain difficulties in this hybrid design.

Negative feedback is very necessary here because the nature of the Schmitt circuit is such that it begins to operate heavily Class B when called upon to pump large charge changes at high frequencies. Without substantial amounts of negative feedback, serious waveform distortions would exist. The feedback must also have much faster response than that needed to process the audio band. This is because the feedback must be fast enough to correct short duration waveform aberrations created in the Class B action of the output circuit.

At the same time, the feedback geometry must be stable both under capacitive load and no-load conditions.

The feedback should be direct-coupled so that positive DC centering of the output quiescent point is maintained.

With these requirements in mind, the negative feedback loop is now explained.

Basic direct-coupled negative feedback is derived through voltage divider action in resistors 142 and 144. This negative feedback is to reduce the audio input at the base of transistor 108. Normal low voltage practice would allow this divided output sample to be applied directly to the emitter of transistor 108.

However, to do so here would require values of feedback dividers so low as to present an unacceptable dissipation problem, since the resistors in the divider are across a static potential of roughly one-half the 5 KV supply.

The solution is therefore to employ NPN transistor 146 operating as a feedback buffer current amplifier.

The signal at the emitter of transistor 146 is an almost perfect replica of that on its base, since the transistor is operating in the emitter follower mode. This emitter signal is now passed through resistor 148 and capacitor 150 and injected into the emitter of transistor 108, where it subtractively cancels all but about 2-3% of the base drive voltage.

Because of the low base current for transistor 146, resistor 142 can be several megohms, thus limiting dissipation to practical levels.

Guard device 152 is used as it is fast enough to satisfactorily guard transistor 146. Because such varistors have a capacitance of several hundred picofarads, it is essential to parallel resistor 142 with capacitor 143. This is necessary so that the feedback divider will have flat frequency response. This is accomplished in practice by connecting capacitor 143 to the output side of capacitor 124 so that capacitor 143 will not be exposed to high DC potentials. This minimizes failure risk in capacitor 143 and limits damage should it short.

Because capacitor 124 is large compared to capacitor 143 and to the speaker capacitance, the net effect is almost as if capacitor 143 directly parellels resistor 142, for compensation purposes.

Capacitors 101, 114, and 150 are selected to provide the fast response necessary to "wash-out" high frequency waveform aberration and provide sufficient forward phase shift at ultrasonic frequencies to guarantee stability under speaker load or no load conditions.

Resistor 106 is used to compensate for component tolerances so that exact centering and clipping symmetry can be achieved.

Diode 111 and resistor 112 serve to limit any back propagation of destructive potential from tube 116 into transistor 108.

Resistor 122 is a current limiting resistor necessary to avoid damage resulting from minor arcs in tube 118.

Resistors 134, 136, 142, 144 and 140 play two other important roles:

First, resistors 134, 136, 142 and 144 provide a speaker always present bleeder network for the potentially hazardous 5 KV power supply. Since a similar chain exists in the lower Schmitt circuit wherein components identical to the upper Schmitt circuit perform similar functions, I have a redundant bleeder network capable of discharging the power supply in a matter of seconds.

Secondly, resistors 134, 136 and 140 are chosen high enough in value so that if a circuit fault causes potentially destructive dissipation levels on the tubes, the screen voltage will quickly drop, drastically limiting current flow through the Schmitt pair.

Capacitor 145 is a bypass to assure low impedance at high frequencies, in power supply connections.

It will be observed by anyone skilled in the amplifier art that transistors 108 and 146 form a complementary difference amplifier. This transistor pair could be a true diffential amplifier using either NPN or preferably PNP transistors. It has been found that the complementary pair used is simpler, more stable and provides higher slew rates.

The use of the PNP final grid driver transistor 10b allows this transistor to directly bias the lower tube of the Schmitt pair. The use of relatively high-voltage transistors results in ample voltage headroom and excellent linearity.

ELIMINATION OF GROUND LOOPS IN SIGNAL PATH

Since the amplifier is designed to be used in a speaker enclosure, for safety and convenience reasons, it is necessary to provide solutions to certain resulting problems.

One of these problems results from the necessity to keep the amplifier chassis "grounded" so that no type of circuit fault will result in a dangerous potential appearing on the chassis. This would be doubly hazardous as such a fault might be carried back through connection cables to the user's preamplifier, thus presenting a shock hazard.

If the chassis is simply grounded through a three wire cord as is often done in many appliances a new problem arises.

This problem is related to the fact that the electrical conduit in a building always has small potential differences even though it is all grounded. These small AC potential differences occur because of appliance leakages, and electric fields from the associated house wiring.

If two of the amplifiers were connected to two different outlets having these small potential differences on the ground circuit, it would not be possible to connect both amplifiers of a stereo pair back to one pre-amplifier without introducing very objectionable hum.

In other words, the conduit potential differences would show up as a hum signal on both amplifiers' inputs.

The elimination of this problem by employing either audio transformers or differential amplifiers has many attendant disadvantages but the solution according to the instant invention comprises "grounding" the chassis through two parallel back-to-back diodes. These diodes are of ample current rating to keep the chassis within a fraction of a volt of earth ground even should a high current fault occur. However, silicon diodes show almost no current flow at the 50–100 millivolt typical drop in the conduit, therefore negligible hum signal is communicated to the amplifier.

AUTOMATIC TURN-ON ACTIVATION

As stated earlier, a circuit which keeps the vacuum tube filaments at a low power standby value and can automatically command the amplifier to assume normal operation, has numerous advantages.

The advantages include (1) "instant-on" operation, (2) increased tube life due to elimination of filament thermal shock, (3) "damp-chaser" effect for high-voltage components and, (4) allows the amplifier to be connected to power outlets near the speaker/amplifier combination without running any power or control cables other than the audio feed cable.

Signal activation of an amplifier is not new. However it is believed that certain features of this circuit are new and possess advantages not easily achieved by more obvious methods.

Tubes 116 and 516 operate with grounded cathodes. It is therefore easy to achieve a low power standby mode by circuit arrangements which simply put the filaments of these two tubes in series in lieu of parallel.

The filaments 118F and 518F (FIG. 2) of tubes 118 and 518 of FIG. 1 are tied to their respective cathodes, and thus experience the full ground to 5 KV signal swing of the amplifier as a common-mode potential. Isolation transformers are thus required which will withstand this high potential present on the filament with respect to ground.

Since the filaments of tubes 118 and 518 cannot be put in series because of this "floated" operation, the same effect in practice is accomplished by putting in series in lieu of parallel the primaries of their respective supply transformers 300 and 302.

To activate the amplifier to normal operation it is also essential to apply power to transformer 304 which provided the +5 KV supply.

Because of the large step-up ratio of this transformer 304 and the moderately large filter capacitors used in the voltage doubler, this transformer reflects a large turn-on surge current which cannot be reliably handled by a small economic relay.

Therefore a solid state switch, triac 308 which activates power to transformer 304 is used. These devices can absorb very large peak transient currents with ease.

The arrangement which combines the series/parallel requirements of the filament circuit with the activation of the triac switch is unique and has advantages of economy, practicality and reliability.

The advantages of the circuit of the invention are related to the elimination of problems associated with providing the gate trigger current for the triac 308. This device requires a gate current in the 50–100 milliamp range which can be either a direct current or a properly phased alternating current, to assure proper switching.

This gate current requirement could be derived using additional components from the AC power line. Besides additional components, more relay poles would be required.

The solution provided by the instant invention derives the gate-trigger current from an already present return current in the primary of transformer 302. The connections made to relay 310 make this happen without additional components or relay poles.

The exact methods by which the circuit accomplishes this operation will now be explained in detail.

Figure 2:
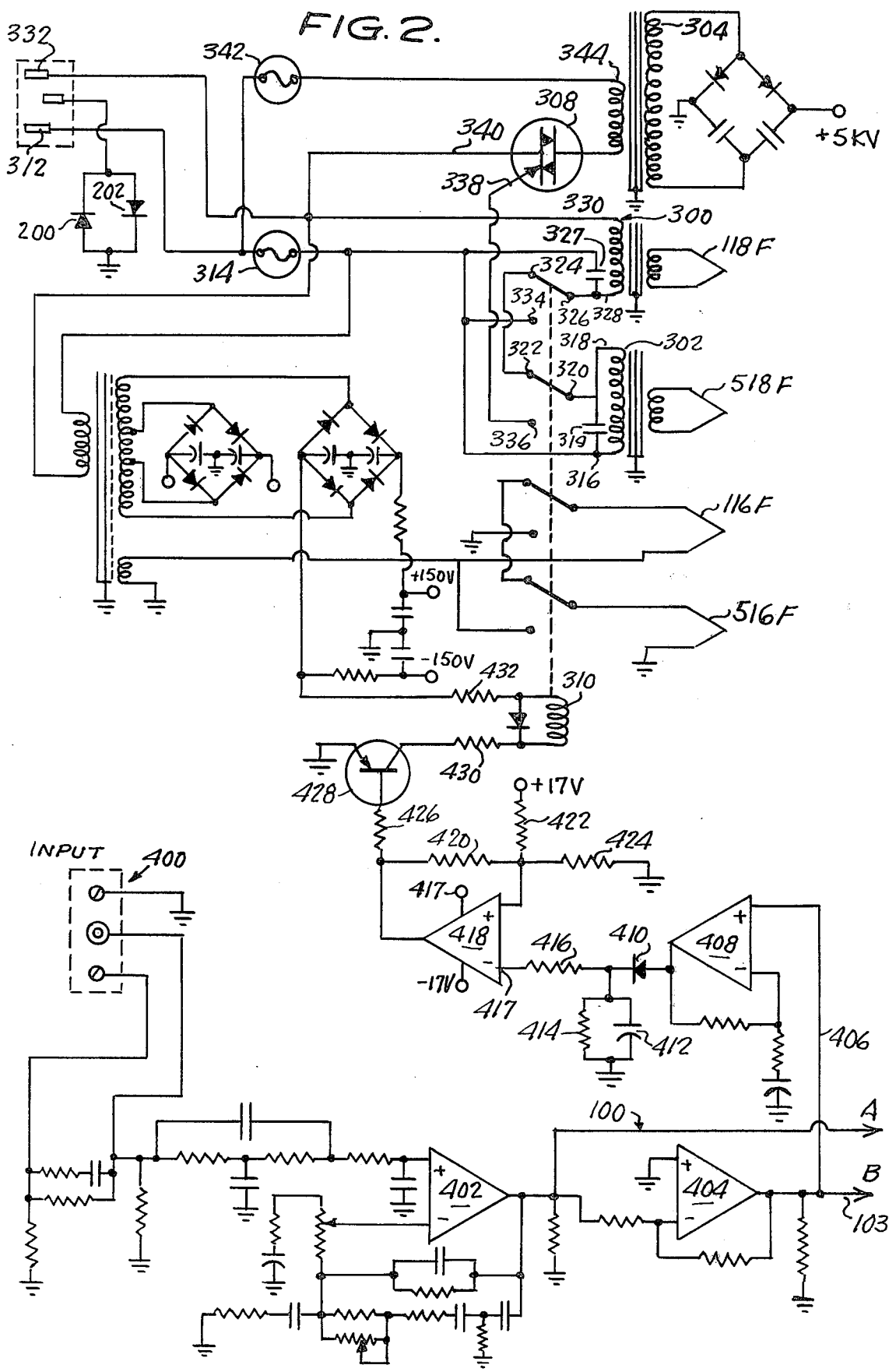
FIG. 2 shows the circuitry leading to FIG. 1 at AB.

Relay 310 is shown in FIG. 2, in the standby mode. Line power is brought in at pin 312 through fuse 314 into primary lead 316 of transformer 302. Current flow continues out primary lead 318 into contact 320 and through the relay to contact 322. Flow continues back into contact 324 to contact 326 and into primary lead 328 of transformer 300. Current flows out primary lead 330 of transformer 300 and returns to power neutral through pin 332.

Thus we see that the primaries of transformers 300 and 302 are in series. The resulting filament voltage on the filaments of tubes 118 and 518 are one-half of operational values.

When the relay is activated by circuitry (to be explained later), the aforementioned line power coming through fuse 314 and appearing on contact 334 now passes through the relay into contact 326 and into primary lead 328 of transformer 300. Since primary lead 330 is the line neutral, full power is now on transformer 300 and thus on the filament of the tube 118.

Line power through fuse 314 is also applied to primary lead 316 of transformer 302. Current from transformer 302 coming out primary lead 318 now passes into relay contact 320 and through the activated relay to contact 336. Current is conducted from contact 336 into triac gate lead 338. This gate current passes through the triac 308 and out lead 340, connected to power neutral and tube filaments 518F is now at full power.

Line current from pin 312 now can flow through fuse 342 through primary 344 of transformer 304 and be returned to power neutral 340 through triac 308 which acts as a closed switch. This has automatically activated the high voltage +5 KV supply.

Capacitors 319 and 327 act as contact arc suppressors.

Filaments of tubes 116F and 516F are moved from series to parallel operations upon relay activation by an arrangement similar to that used for the primaries of transformers 300 and 302.

LOW LEVEL SIGNAL PROCESSING

The signal processing steps accomplished by the four operational amplifier stages and their associated components are rather conventional and will be explained rather briefly to complete the operational understanding of the circuit. They do not comprise invention beyond the state of the art.

Audio signals arriving from associated equipment at input jack system 400 are processed by various resistors and capacitors for gain control and response equalization purposes and are then amplified by operational amplifier 402.

The output of op-amp 402 is communicated along line 100 to drive the previously discussed hybrid output state of FIG. 1. Op-amp 404 is connected as a unity-gain phase inverter to provide a signal on line 103 which is a 180° out-of-phase replica of the signal on line 100. This causes the Schmitt output circuits to feed a push-pull high voltage drive signal to the electrostatic transducer.

The output of phase-inverter op-amp 404 also feeds through line 406 op-amp 408 which provides an additional signal gain of about 40 dB. This is done to allow the automatic turn-on circuit to function at levels about 50 dB below the amplifier's full output.

The output of op-amp 408 is rectified by diode 410 and charges capacitor 412 to a value near the +17 volts of the positive supply rail. Resistor 414 is selected to give a time constant of about 5 minutes with capacitor 412.

The potential across capacitor 412 is communicated through resistor 416 to the inverting input of op-amp 418. Resistors 420, 422 and 424 cause the op-amp 418 to act as a Schmitt-trigger circuit with a decision point at about 5½ volts, i.e. about one-third of the positive supply rail.

The use of positive feedback through resistor 420 causes the Schmitt trigger action, i.e. the "snap" wherein the output of the op-amp 418 is bi-stable, thus establishing a reliable "off" or "on" state for the transistor which proceeds it.

This bi-stable voltage, which is approximately the full rail-to-rail swing of the op-amp 418 produces a current through resistor 426 into the base of PNP transistor 428, when the op-amp output is at its negative state.

Because op-amp 418 is operated as an inverting Schmitt-trigger circuit, positive drive at point 417 will cause the output of op-amp 418 to swing to its full negative value. The resulting current through resistor 426 provides forward base current for PNP transistor 428 causing collector current to flow. This current flow passes through resistor 430, and is returned to the −150 volt supply. This results in activation of the relay and transition of the amplifier to full power operation.

Approximately five minutes after the cessation of audio input to the amplifier, resistor 414 will have discharged capacitor 412 to the decision point of the Schmitt-trigger circuit, since diode 410 will no longer be charging capacitor 412.

Automatic return to standby operation occurs at this time, until audio signals are again applied to the amplifiers input.

Resistor 154 of FIG. 1 is a high-value resistor, typically a few hundred megohms used to provide potential for the diaphragm of the speaker. This high-value allows constant charge operation of the diaphragm which is the most linear method known for such speakers.

SUMMARY OF ADVANTAGES

1. Use of a complementary difference amplifier.
2. Use of a PNP transistor to automatically bias the lower Schmitt-tube.
3. Compensated feedback network co-operating with guard devices arranged for lowest fault damage.
4. Forward phase-lead compensation to achieve high-speed transistor portions of circuit and assure stability under load and no-load conditions.
5. Automatic over-current protection.
6. Intrisic redundant bleeders.
7. Chassis grounding through "float" diodes to prevent ground-loop induced hum.
8. Simplified series/parallel operation of lower tube filaments for standby with series/parallel operation of upper tube filament transformer primaries with intrinsic operation of power triac gate are provided by return current of one upper filament transformer primary, thus reliably switching the high power supply with no additional components (other than the triac) and thereby allowing use of commonly available economic four-pole relay.

Having thus described the preferred embodiment of the invention it should be understood that numerous structural modifications and adaptations may be resorted to without departing from the spirit of the invention.

I claim:

1. An amplifier for driving a capacitive load and adapted to receive a signal in the audio frequency range from an associated preamplifier source, the amplifier comprising: at least one power output tube arrangement including a driving tube with mean connected to drive a driven tube; and an output section connected to cooperate with said power output tube arrangement, said output section including:
    (a) a feedback network;
    (b) a difference amplifier, said difference amplifier including a pair of complementary drive transistors, the first of said pair of drive transistors having a collector output connected to an input of said driving tube of said power output tube arrangement, the second of said pair of drive transistors having a base input connected to an output of said driven tube of said power output tube arrangement through said feedback network, and,
    wherein said feedback network includes a first resistor connected in series between said base of second transistor and said output tube arrangement, a second resistor connected between said base of said second transistor and ground to form a bleeder network with said first resistor, a third resistor connected in parallel with a capacitor disposed between the emitters of said first and second transistors to adjust gain and phase for stability, and a guard device connected to the base of said second transistor to protect said second transistor from high voltage spikes, and a compensation capacitor connected between the output of said output tube arrangement and the base of second transistor to achieve flat frequency response at said audio frequency range in said feedback network, and
    the phase of said first transistor is connected to receive said audio range signals, and whereby said power output tube arrangement in co-operation with said transistorized difference amplifier provide low distortion, positive self-certering and high order stability power amplification of said audio range signals.

2. An amplifier according to claim 1, wherein said capacitive load comprises an electrostatic loudspeaker.

3. An amplifier according to claim 1 or 2, wherein said guard device comprises a metal oxide varistor connected to ground, and whereby a capacitance associated with said guard device co-operates with said compensation capacitor to achieve said flat response.

4. An amplifier according to claim 1 or 2, wherein said bleeder network comprises in addition to said first and second resistors, a fourth resistor connected from the cathode of said driven tube of said output tube arrangement to a screen grid in said driven tube, and a fifth resistor connected between said fourth resistor and the power supply for said driven tube to provide a bleeder network for said power supply.

5. An amplifier according to claim 1 or 2, including a pair of parallel, back-to-back diodes grounded to the chassis of the amplifier for minimizing hum.

6. An amplifier according to claim 1 or 2, including power supply transformers connected to filaments of tubes of said output tube arrangement for applying a low power standby value to said filaments, said power transformers having primary windings arranged to be connected in series relative to each other and for connecting said primary windings to a power source to thereby maintain said filaments at reduced power.

7. An amplifier according to claim 1 or 2, including a relay means for changing said filaments from a standby mode to a full power mode, a step-up transformer, a triac for applying power to said step-up transformer, said relay means including a relay with contacts connected to said primary windings so that when said relay is energized, said contacts completes a circuit for activating said triac to apply power to said step-up transformer.

8. An amplifier according to claim 7, wherein said relay means includes switch means for changing said filaments from a series orientation when said filaments are in said full power mode.

9. An amplifier arrangement comprising a plurality of said output sections and a plurality of said power output tube arrangements according to claim 1 or 2, each respective driving tube of said plurality of power output tube arrangements having its screen grid connected to corresponding grids of the other driving tubes.

* * * * *